US006627587B2

(12) United States Patent
Naghshineh et al.

(10) Patent No.: US 6,627,587 B2
(45) Date of Patent: *Sep. 30, 2003

(54) CLEANING COMPOSITIONS

(75) Inventors: Shahriar Naghshineh, Allentown, PA (US); Yassaman Hashemi, Allentown, PA (US)

(73) Assignee: ESC Inc., Bethlehem, PA (US)

( * ) Notice: Subject to any disclaimer, the term of this patent is extended or adjusted under 35 U.S.C. 154(b) by 66 days.

This patent is subject to a terminal disclaimer.

(21) Appl. No.: 09/839,475

(22) Filed: Apr. 19, 2001

(65) Prior Publication Data

US 2003/0017962 A1 Jan. 23, 2003

(51) Int. Cl.[7] .............................. C11D 1/66; C11D 1/62; C11D 3/30
(52) U.S. Cl. .................. 510/175; 510/176; 510/245; 510/255; 510/257; 510/259; 510/264; 510/499; 510/488; 510/477; 510/504
(58) Field of Search ................... 510/175, 176, 510/245, 255, 257, 259, 264, 499, 477, 488, 504; 134/1.3, 39, 40

(56) References Cited

U.S. PATENT DOCUMENTS

| 4,617,251 A | 10/1986 | Sizensky | 430/256 |
| 4,770,713 A | 9/1988 | Ward | 510/212 |
| 5,143,648 A | 9/1992 | Satoh et al. | 252/403 |
| 5,419,779 A | 5/1995 | Ward | 134/38 |
| 5,597,420 A | 1/1997 | Ward | 134/38 |
| 5,972,862 A | 10/1999 | Torii et al. | 510/175 |
| 5,981,454 A | 11/1999 | Small | |
| 5,997,658 A | 12/1999 | Peters et al. | 134/38 |
| 6,044,851 A | 4/2000 | Grieger et al. | 134/1.3 |
| 6,191,086 B1 * | 2/2001 | Leon et al. | 510/175 |
| 6,194,366 B1 * | 2/2001 | Naghshineh et al. | 510/175 |

FOREIGN PATENT DOCUMENTS

| EP | 0 647 884 A1 | 4/1995 |
| EP | 0 871 209 A1 | 10/1998 |
| WO | WO 98/30667 | 7/1998 |

OTHER PUBLICATIONS

Search Report dated Aug. 6, 2002 for International Application No. PCT/US 02/11739 dated Apr. 12, 2002.

* cited by examiner

Primary Examiner—Gregory Delcotto
(74) Attorney, Agent, or Firm—RatnerPrestia

(57) ABSTRACT

An aqueous cleaning composition comprising an alkanolamine, a tetraalkylammonium hydroxide, nonmetallic fluoride salt, a corrosion inhibitor, e.g. ascorbic acid or its derivatives alone or in combination, balance water. Such cleaning compositions are effective to remove residues from plasma process generated organic, metal-organic materials, inorganic salts, oxides, hydroxides or complexes in combination with or exclusive of organic photoresist films at low temperatures with little corrosion of copper and attack of dielectric substrates.

5 Claims, 3 Drawing Sheets

Image Statistics
Img. 2 range        20.621 nm
Img. Mean           -0.0002 nm
Img. Raw mean       1.202 nm
Img. Rms (Rq)       1.258 nm
Img. Ra             0.918 nm Box Statistics
2 range
Mean
Raw mean
Rms (Rq)
Mean roughness (Ra)
Box x dimension
Box y dimension

CLEANING COMPOSITIONS

FIELD OF THE INVENTION

The present invention relates to improved cleaning compositions comprising organic amines, particularly, monoethanolamine, tetramethylammonium hydroxide, fluoride containing salts, a corrosion inhibitor e.g. ascorbic acid, surfactant and water.

BACKGROUND OF THE INVENTION

The present invention relates to a cleaning composition for semiconductor substrate surfaces used in the Back End of The Line (BEOL) production steps during the manufacture of semiconductor devices. In particular those semiconductor devices where copper is used as the conductor and interconnects with regard to a process known as double damascene. During BEOL manufacturing steps used in the production of the newest semiconductors and semiconductor microcircuits copper, (Cu) is used to produce the latest high-density devices. Surface etching of the various substrates is one step utilized to build the circuits during manufacturing of a semiconductor device. Following these etching processes the remaining photoresist, comprising an organic coating deposited on the substrate to be etched, is removed by wet or dry stripping methods, generally called ashing. Subsequently it is necessary to remove any residual organic and inorganic contamination remaining, commonly referred to as sidewall polymer (SWP). This SWP typically consists of post etch and post ash residues such as polymers, salts, metallic contamination and particles. It is desirable to develop an improved cleaning composition to remove the SWP without corroding, dissolving or increasing the resistance of the metal circuitry or chemically altering the exposed substrates on the wafer surface.

Amine solvents currently used to remove these residues corrode the copper substrates and cause degradation or failure of the intended device. It is therefore desirable to provide solutions containing corrosion inhibitors such that these compositions can be used to remove various types of residues from copper substrates and dielectrics without degrading or destroying the device.

U.S. Pat. No. 4,617,251 to Sizensky discloses a cleaning composition that is prepared with a select amine and an organic polar solvent. This composition is formed utilizing from about 2% to about 98% by weight of amine compound and about 98 to 2% of an organic polar solvent.

U.S. Pat. No. 4,770,713 to Ward discloses a cleaning composition comprising an alkylamine and an alkanolamine.

U.S. Pat. No. 5,419,779 to Ward discloses a process for removing an organic coating from a substrate by applying a composition consisting of about 62% by weight of monoethanolamine, about 19% by weight hydroxylamine, a corrosion inhibitor that includes gallic acid and gallic acid esters, and water.

U.S. Pat. No. 5,997,658 to Peters et al. discloses cleaning compositions comprising water, an alkanolamine and a corrosion inhibitor being one of, benzotriazole gallic acid and gallic acid esters.

U.S. Pat. No. 5,597,420 to Ward discloses a cleaning composition free of hydroxylamine compounds that consists essentially of monoethanolamine and water together with a corrosion inhibitor. The preferred inhibitor includes gallic acid and it's esters.

European Patent No. 0647884A1 to Schwartzkopf et al, discloses photoresist strippers containing reducing agents to reduce metal corrosion. This patent teaches the use of ascorbic acid, gallic acid pyrogallol among others for the control of metal corrosion in alkali containing components.

U.S. Pat. No. 5,143,648 to Satoh et al., discloses novel ascorbic acid derivatives as antioxidants.

U.S. Pat. No. 5,972,862 to Torii et al., discloses the use of fluorine containing compounds with a quaternary ammonium salt, a water soluble or miscible organic solvent, an inorganic or organic acid and a surfactant.

U.S. Pat. No. 6,044,851 to Grieger et al., discloses the use of fluorine containing compounds with a quaternary ammonium fluoride, a water soluble or miscible organic solvent and a surfactant.

Moreover, heretofore, available cleaning compositions have required unduly long residence times or repeated applications in order to remove certain residues.

SUMMARY OF THE INVENTION

A suitable aqueous cleaning composition has been discovered that eliminates or substantially reduces the disadvantages or drawbacks of corrosion or substrate attack, particularly of copper, found with prior art cleaning components.

In view of the fact that prior art compositions have many short comings, the cleaning compositions according to the present invention are water miscible and biodegradable. Cleaning compositions according to the present invention are substantially non-flammable, non-corrosive, evidence relatively little (if any) tendency to evaporate, and are generally unreactive.

Compositions according to the invention not only remove residue, but have a high degree of efficacy, particularly at lower temperatures than is generally required with prior cleaning compositions.

Compositions according to the invention exhibit substantially no corrosive effects on the substrate, especially those containing copper, dielectrics or silicon.

Furthermore cleaning compositions according to the invention are devoid of undesirable chlorinated or phenolic components such as gallic acid, pyrogallol, and catechol or do not require the use of hot highly caustic components would be welcome by a semiconductor manufacturer, especially if the cleaning compositions and use thereof are not considered undesirable by regulatory agencies overseeing their production and use.

Most compositions according to the invention provide complete removal of residue, where such results are not always obtainable with the individual components for the removal of sidewall organometallic and metal oxide residues without any substantial corrosion of a copper substrate. Compositions according to the invention have a component of the composition or process that overcomes the aging problems associated with the phenolic type inhibitors.

Therefore in one aspect the present invention is a cleaning composition comprising from about 4 to 14% by weight monoethanolamine, from about 2 to 6.0% by weight Tetralkylammonium hydroxide, from about 0.3 to 3.5% by weight fluoride ion, a corrosion inhibitor being an effective amount of ascorbic acid; balance deionized water.

In another aspect the present invention is a method of cleaning a semiconductor device having an organic, metal organic polymer, inorganic salt, oxide, hydroxide, and/or complexes or combinations thereof as a film or residue comprising the steps of; contacting the semiconductor device with a cleaning composition containing from 4 to 14% by weight monoethanolamine, about 0.2 to 6.0% by weight tetralkylammonium hydroxide, about 0.3 to 3.5% by weight fluoride ion, an effective amount of ascorbic acid corrosion inhibitor, balance water at a temperature of between 25° C. and 50° C. for a period of time between 5 minutes and 60 minutes, rinsing the semiconductor device in deionized water, and drying the semiconductor device.

DETAILED DESCRIPTION OF THE PREFERRED EMBODIMENTS

Figure 1:
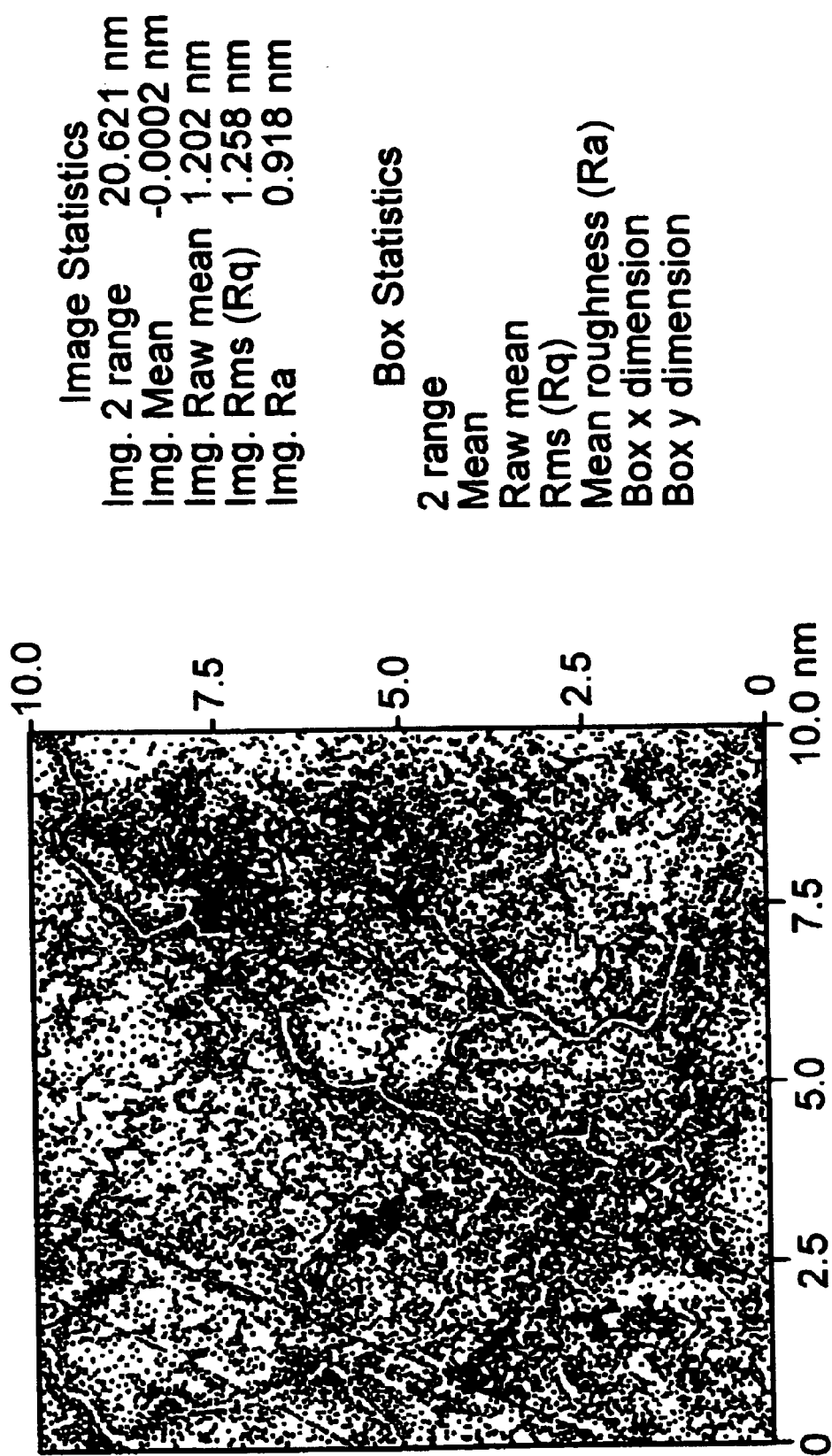
FIG. 1 is an atomic force microscopy (AFM) view of an electrochemically deposited (ECD) copper wafer with slight chemical mechanical planarization (CMP).

According to the present invention a cleaning composition consisting of water, organic amines, tetraalkylammonium hydroxide, a fluoride containing salt of a nonmetallic nature, and a surfactant, is significantly improved by mixing therewith an effective amount of corrosion inhibitor being one of ascorbic acid or it's derivatives.

A preferred amount of inhibitor is about 0.5 to 10% by weight.

The preferred organic amines are alkanolamines, and most preferably is monoethanolamine (MEA). The preferred amount of amine is from about 4 to 14% by weight.

The preferred tetraalkylammonium hydroxide is tetramethylammonium hydroxide. The preferred amount of tetramethylammonium hydroxide is from about 2 to 6% by weight.

Optionally, a nonionic surfactant may be added in an amount to enhance the lowering of surface tension to aid in the removal of residue.

The preferred fluoride containing salts are tetraalkylammonium fluorides, ammonia fluoride, ammonia bifluoride, most preferably tetramethylammonium fluoride (TMAF). The preferred amount of fluoride concentration is 0.3 to 3.5% by weight as fluoride.

The balance of the formulation is water preferably deionized water. The preferred amount of water is from about 65 to 90% by weight.

The novel cleaning compositions of the invention exhibit synergistically enhanced corrosion inhibiting action and cleaning capabilities at low temperatures, properties not possible from the use of the individual components or in combination with other cleaning components when the inhibitors are not present.

Cleaning compositions of the invention provide an effective cleansing action as well as superior copper corrosion protection and little or no attack of the dielectrics, e.g. TEOS (tetraethylorthosilicate), dielectric compositions of Dow Chemical Company sold under the trademark SiLK, or BPSG (boro-phosphate silicate glass).

Aqueous cleaning compositions of the invention consist of, by weight, about 4 to 14% monoethanolamine in combination with, about 2.5 to 6% tetramethylammonium hydroxide, about 0.3 to 3.5% fluoride ion, about 0.5 to 10% corrosion inhibitor, preferably ascorbic acid, balance water. A preferred composition uses from 1 to 5% by weight ascorbic acid. Optionally a non-ionic surfactant may also be employed to aid in residue removal.

The cleaning compositions of the present invention are especially useful and advantageous for numerous reasons, inter alia, the following:

(1) Higher cleaning efficacy at low temperatures for a wide variety of coatings and substrates (2) Removal of photoresist's residue and residues from plasma processing used in integrated circuit fabrication.

(3) Ease of preparation by simply mixing the components at room temperature.

The method of the invention is carried out by contacting a substrate containing an organic or metal-organic polymer, inorganic salt, oxide, hydroxide or complex or combination thereof as a film or residue, (i.e. sidewall polymer (SWP)), with the described striping composition followed by rinsing and drying the substrate. The actual conditions, i.e., temperature, time, etc. depend on the nature and thickness of the complex (photoresist residue and/or sidewall polymer) material to be removed, as well as other factors familiar to those skilled in the art. In general, for photoresist cleaning, the photoresist is contacted by, or the coated device is dipped into a vessel containing the cleaning composition, at a temperature between 25–50° C. typically for a period of about 5–60 minutes then, rinsed with water and then dried with an inert gas or "spin dried".

Examples of organic polymeric materials include photoresists, electron beam resists, X-ray resists, ion beam resists, and the like. Specific examples of organic polymeric materials include positive resists containing phenol formaldehyde type resins or poly (p-vinylphenol), polymethylmethacrylate-containing resists, and the like. Examples of plasma processing residues (sidewall polymer) include among others; metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, fluorosilicate glass (FSG), boron phosphorous silicon glass (BPSG), copper, copper, tungsten, metal nitrides, etc.

The effectiveness and unexpected nature of the cleaning compositions of the invention is illustrated, but not limited by, the data presented in the following examples. Unless otherwise specified, all parts and percentages are by weight.

EXAMPLE 1

In order to demonstrate the cleaning efficacy and corrosion inhibition, different levels of fluoride were used in the cleaning compositions. The following formulations were prepared and tested for corrosion protection of double damascene copper processed wafers and partially planarized electrochemically deposited copper wafers. The time and temperature were 10 minutes and 50° C. respectively.

TABLE 1

| Formulation | A | B | C | Control |
|---|---|---|---|---|
| MEA | 9 | 9 | 9 | Copper Wafer |
| TMAH | 5 | 5 | 5 | |
| NH$_4$F.HF | 0.5 | 2.75 | 5 | |
| Ascorbic Acid | 3.5 | 3.5 | 3.5 | |
| Water | 82 | 79.75 | 77.5 | |
| % Fluoride in Solution | 0.33 | 1.83 | 3.33 | |
| Surfactant? y/n | yes | yes | yes | |
| AFM RMS (average) nM | 1.113 | 1.573 | 1.981 | 1.061 |
| AFM Z Range (average) nM | 32.347 | 35.572 | 56.779 | 28.844 |
| Damascene Wafer Clean y/n | yes | yes | yes | |

The data in Table 1 indicates that at all of the levels of fluoride shown the composition cleans the patterned wafer and that there is very little change in the copper surface. Shown in FIG. 1 is a comparison of atomic force microscopy AFM scans of an electrochemically deposited (ECD) wafer surface with a slight mechanical planarization identified as Control No Treatment, with a similar wafer treated with formulation B of Table 1 at 22° C. for 10 minutes. FIG. 1 shows the wafer treated according to the invention has a slight surface roughness.

EXAMPLE 2

In order to demonstrate the cleaning efficacy of compositions according to the invention, tests were conducted to determine the effect of the combination of constituents on the efficacy of the solution. Dual damascene copper architecture wafers containing post ash etch residue were immersed in cleaning formulations according to the invention with low velocity mixing in beakers at 50° C. for 5 minutes. The wafers were then evaluated with scanning electron microscopy (SEM) images for cleaning efficacy.

TABLE 2

| Formulation | O | P | R | S |
|---|---|---|---|---|
| MEA | 4.5 | 4.5 | 12 | 0 |
| TMAH | 2.5 | 2.5 | 0 | 6 |
| TMAF | 16.75 | 0.00 | 16.75 | 14.60 |
| Ascorbic Acid | 1.75 | 1.75 | 3 | 3 |
| Water | 74.50 | 91.25 | 68.25 | 76.40 |
| % Fluoride in Solution | 3.42 | 0.00 | 3.42 | 2.98 |
| Surfactant? y/n | yes | yes | yes | yes |
| Damascene Wafer Clean y/n | yes | no | no | no |

The data of Table 2 show a surprising result in that only the composition identified as O with all the constituents of the mixture, except surfactant provided adequate cleaning.

EXAMPLE 3

In order to demonstrate the compatibility of the composition of the invention with different dielectric substrates various wafers were treated. The cleaning compositions, having the formulations set forth in Table 3 were prepared and tested on wafers having BPSG, TEOS, and SiLK produced dielectric deposits. The time and temperature were 60 minutes and 25° C. respectively.

TABLE 3

| Formulation | A | T | U | X |
|---|---|---|---|---|
| MEA | 9 | 9 | 9 | 9 |
| TMAH | 5 | 5 | 5 | 5 |
| NH$_4$F.HF | 0.5 | 1 | 2 | 3 |
| Ascorbic Acid | 3.5 | 3.5 | 3.5 | 3.5 |
| Water | 82 | 81.5 | 80.5 | 79.5 |
| % Fluoride in Solution | 0.33 | 1.83 | 1.33 | 2.00 |
| Surfactant? y/n | yes | yes | yes | yes |
| Etch Rates Å/min | <1 | <1 | <1 | <1 |
| BPSG | <1 | <1 | <1 | <1 |
| TEOS | <1 | <1 | <1 | <1 |
| SiLK | <1 | <1 | <1 | <1 |

The data in Table 3 clearly show a surprising result, namely, there was no attack on the surfaces. Fluoride containing cleaning composition generally attack silicon containing materials.

EXAMPLE 4

In order to demonstrate the efficacy of the cleaning capabilities with the different levels of the components, a series of formulations summarized in Table 4 were prepared. Dual damascene wafers containing post ash etch residue were immersed in these cleaning formulations and treated with low velocity mixing in beakers at 50° C. for 5 minutes. The wafers were then evaluated with scanning electron microscopy (SEM) images for cleaning efficacy and surface damage.

TABLE 4

| Formulation | E | F | G | H | I | J | K | L | M | N |
|---|---|---|---|---|---|---|---|---|---|---|
| MEA | 4.5 | 12 | 4.5 | 12 | 9 | 9 | 12 | 4.5 | 9 | |
| N-Methylethanol amine | 0 | 0 | 0 | 0 | 0 | 0 | 0 | 0 | 0 | 11 |
| TMAH | 6 | 2.5 | 6 | 2.5 | 5 | 5 | 2.5 | 6 | 5 | 5 |
| TMAF | 3.26 | 3.26 | 0.00 | 0.00 | 3.26 | 0.00 | 3.26 | 3.26 | 0.00 | 3.264 |
| Ascorbic Acid | 3 | 3 | 3 | 3 | 3.5 | 3.5 | 3 | 3 | 3.5 | 3.5 |
| Water | 83.24 | 79.24 | 86.50 | 82.50 | 79.24 | 82.50 | 79.24 | 83.24 | 82.50 | 77.24 |
| % Fluoride in Solution | 0.67 | 0.67 | 0.00 | 0.00 | 0.67 | 0.00 | 0.67 | 0.67 | 0.00 | 0.67 |
| Surfactant? y/n | yes | yes | yes | yes | yes | yes | no | no | no | yes |
| Damascene Wafer Clean y/n | yes | yes | no | no | yes | no | yes | yes | no | no |
| Substrate Attack | no | no | no | no | no | no | no | no | no | yes |

Figure 2:
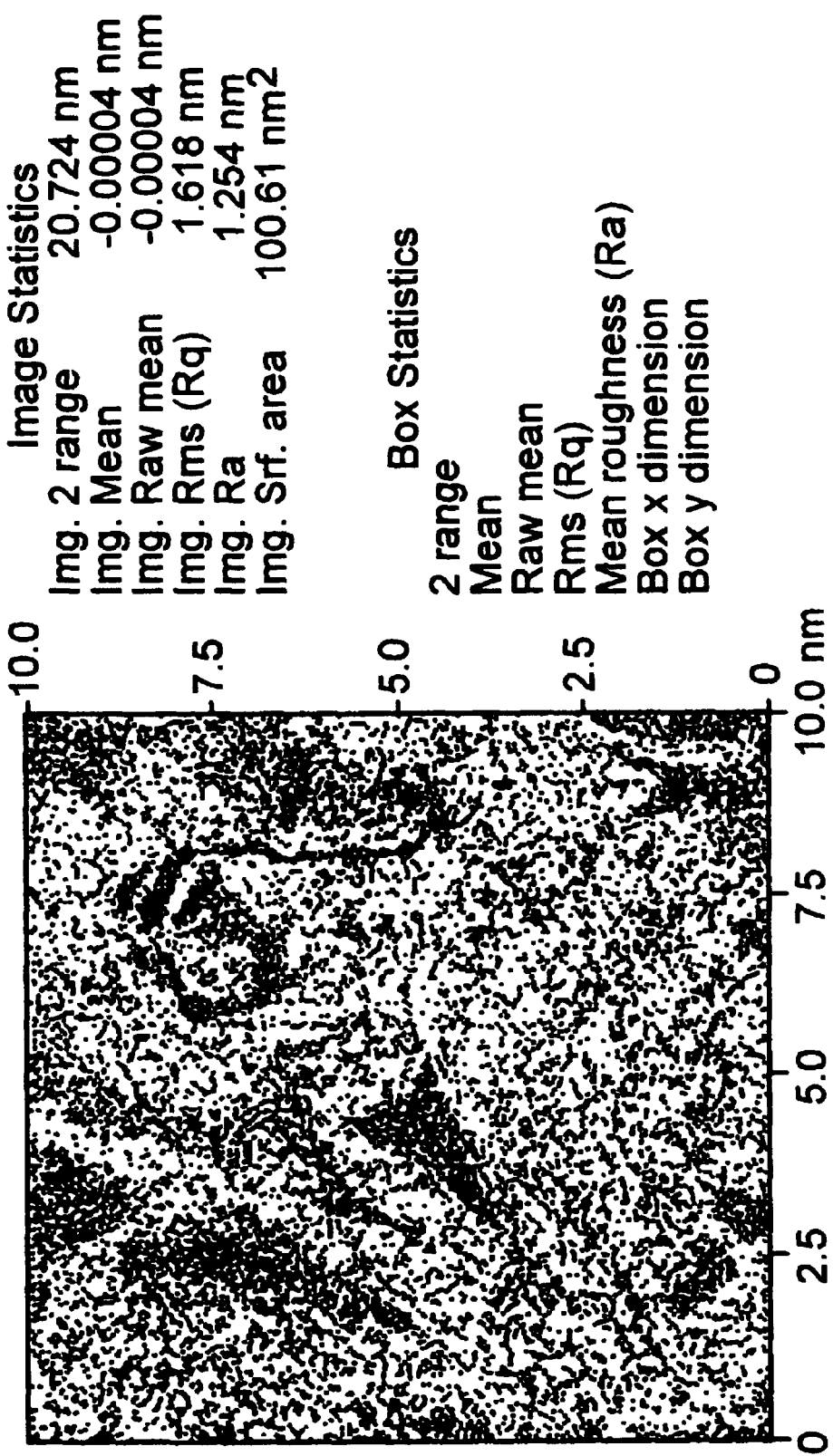
FIG. 2 is an atomic force microscopy (AFM) view of an electrochemically deposited (ECD) copper wafer identical to the wafer in FIG. 1 with slight chemical mechanical planarization (CMP), the wafer treated with a cleaning composition according to the present invention.
Figure 3:
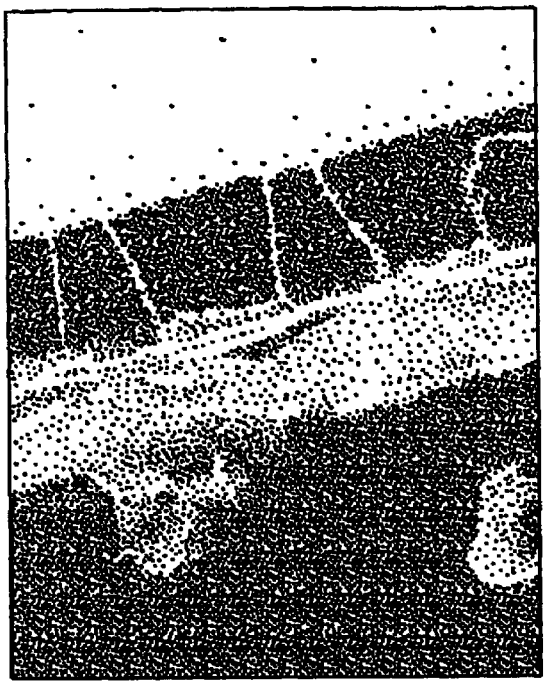
FIG. 3 is a scanning electron microscopy (SEM) image of an untreated damascene wafer.
Figure 4:
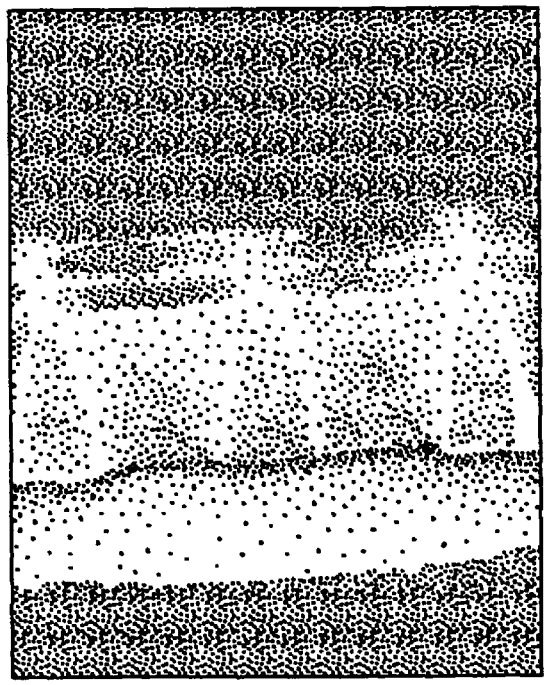
FIG. 4 is a scanning electron microscopy (SEM) image of an identical wafer to that of FIG. 3 treated with a cleaning composition according to the present invention.

From Table 4 it should be noted that formulations E, F, I, K and L cleaned the wafer without visible signs of corrosion of the substrate surface, whereas formulations G, H, J, M and N did not clean the substrate surface and solution N visibly attacked the substrate surface. FIG. 2 is a comparison of SEM images of an untreated wafer and a wafer after treatment in solution K of Table 4.

Therefore, a goal of the invention; to provide a non-corroding cleaning composition to be used in the manufacture of semiconductor devices that is effective for residue, polymer and contamination removal at low temperatures is achieved with the composition disclosed herein.

The compositions of the invention provide cleaning compositions that show negligible silicon etch rate.

Furthermore, the compositions of the invention provide an inhibitor that is less expensive and is more effective as a corrosion inhibitor than catechol, pyrogallol, gallic acid or its esters alone or in combination.

Another goal of the invention; to provide a method for cleaning a coated substrate which can be accomplished at low temperatures which does not cause redeposition of metal ions has been achieved.

Having thus described our invention what is desired to be secured by Letters Patent of the United States is set forth in the appended claims which should be read without limitation.

What is claimed is:

1. A cleaning composition for post-etch ash cleaning of semiconductor devices having a film or residue of an organic, metal organic polymer, inorganic salt, oxide, hydroxide, and/or complexes or combinations thereof comprising:
    from about 4 to 14% by weight monoethanolamine;
    from about 2 to 6.0% by weight Tetralkylammonium hydroxide;
    from about 0.3 to 3.5% by weight fluoride ion resulting from ionization of a salt of a non-metallic fluoride compound in said composition;
    0.5 to 10% by weight ascorbic acid;
    balance deionized water.

2. A cleaning composition according to claim 1, wherein said ascorbic acid is present in an amount of from 1 to 5% by weight.

3. A cleaning solution according to claim 1, including an effective amount of a nonionic surfactant.

4. The cleaning composition of claim 1, wherein said fluoride ion is produced from, one of, ammonium bifluoride, ammonium fluoride, tetralkylammonium fluorides of the group $(R)_4NF$ where R can be alkanes with C1 to C5 or mixtures thereof.

5. The cleaning composition of claim 1, wherein said fluoride ion is provided by using hydrofluoric acid in said composition.

* * * * *